(12) United States Patent
Moriya et al.

(10) Patent No.: US 10,312,101 B2
(45) Date of Patent: Jun. 4, 2019

(54) SUBSTRATE PROCESSING METHOD AND SUBSTRATE PROCESSING APPARATUS

(71) Applicant: TOKYO ELECTRON LIMITED, Tokyo (JP)

(72) Inventors: Shuji Moriya, Yamanashi (JP); Masahiko Tomita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 13 days.

(21) Appl. No.: 15/486,145

(22) Filed: Apr. 12, 2017

(65) Prior Publication Data

US 2017/0316947 A1 Nov. 2, 2017

(30) Foreign Application Priority Data

Apr. 27, 2016 (JP) ................. 2016-089146

(51) Int. Cl.
| | | |
|---|---|---|
| *H01L 21/302* | (2006.01) | |
| *H01L 21/3065* | (2006.01) | |
| *H01L 21/28* | (2006.01) | |
| *H01L 21/02* | (2006.01) | |
| *H01L 21/67* | (2006.01) | |

(52) U.S. Cl.
CPC ...... *H01L 21/3065* (2013.01); *H01L 21/0228* (2013.01); *H01L 21/28194* (2013.01); *H01L 21/67069* (2013.01); *H01L 21/67248* (2013.01)

(58) Field of Classification Search
CPC ........... H01L 21/3065; H01L 21/67069; H01L 21/0228; H01L 21/28194; H01L 21/3141

USPC ........................... 438/706, 719, 734
See application file for complete search history.

(56) References Cited

U.S. PATENT DOCUMENTS

| | | | |
|---|---|---|---|
| 2013/0220377 A1 | 8/2013 | Sato et al. | |
| 2015/0270140 A1* | 9/2015 | Gupta | H01L 21/32136 216/67 |
| 2016/0181116 A1* | 6/2016 | Berry, III | H01L 21/31116 438/715 |
| 2016/0293398 A1* | 10/2016 | Danek | H01L 21/0228 |

FOREIGN PATENT DOCUMENTS

JP          4739709          5/2011

OTHER PUBLICATIONS

Tajima Satoshi et al., "MEMS sacrificial layer Si etching without using a plasma", NanotechJapan Bulletin vol. 7, No. 4, 2014, "Nanotechnology Express" the 26th Special Issue, 1-5.

* cited by examiner

Primary Examiner — Binh X Tran

(57) ABSTRACT

A substrate processing method includes a fluorine-based gas supply step of supplying a fluorine-based gas into a processing chamber where a substrate having a silicon-based film is accommodated, a purge gas supply step of supplying a purge gas for discharging the supplied fluorine-based gas into the processing chamber. The substrate processing method further includes a nitrogen-based gas supply step of supplying a nitrogen-based gas into the processing chamber from which the fluorine-based gas has been discharged. In the substrate processing method, at least in the fluorine-based gas supply step and the purge gas supply step, a temperature of the substrate is maintained at 60° C. or less.

5 Claims, 3 Drawing Sheets

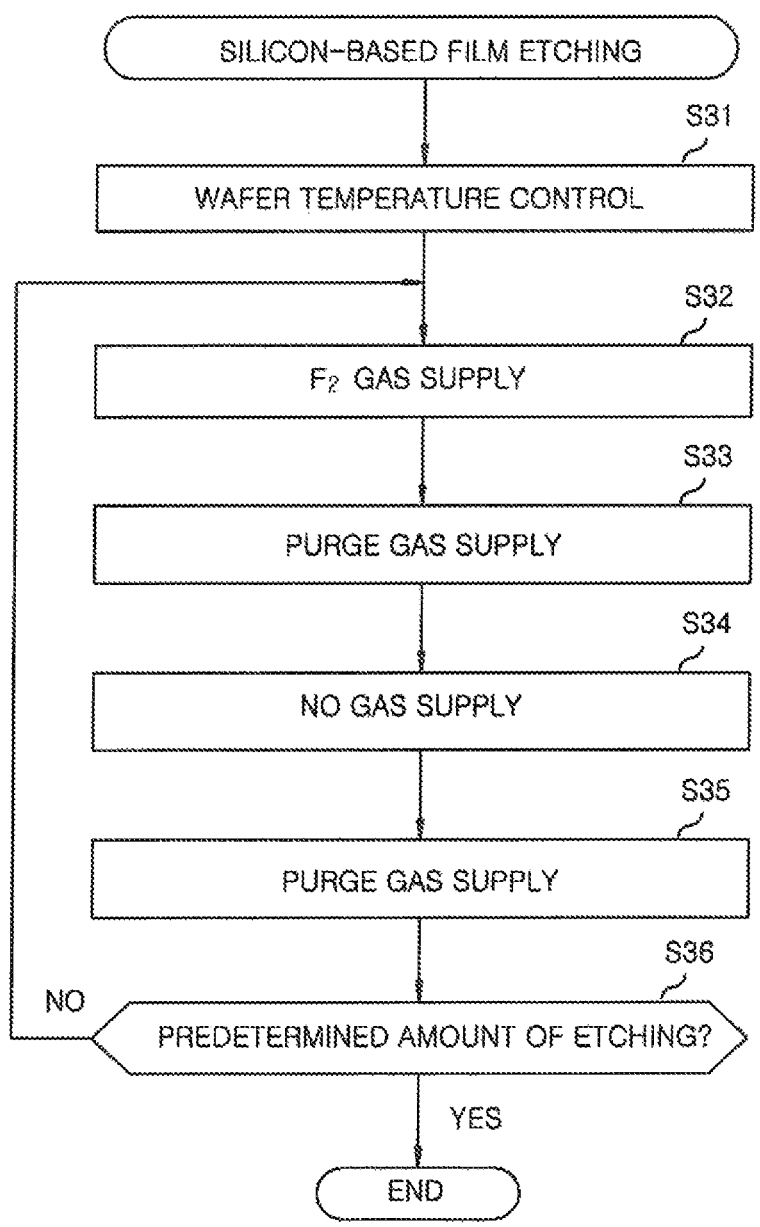

SUBSTRATE PROCESSING METHOD AND SUBSTRATE PROCESSING APPARATUS

CROSS-REFERENCE TO RELATED APPLICATION

This application claims priority to Japanese Patent Application No. 2016-089146 filed on Apr. 27, 2016, the entire contents of which are incorporated herein by reference.

FIELD OF THE INVENTION

The disclosure relates to a substrate processing method and a substrate processing apparatus for etching silicon of a substrate without using a plasma.

BACKGROUND OF THE INVENTION

Generally, a plasma is used to etch silicon of a semiconductor wafer (hereinafter, simply referred to as "wafer"). However, a plasma for etching silicon needs to be generated from chlorine ($Cl_2$) gas, hydrogen bromide (HBr) gas or the like, which requires a high environmental load and a high cost. Therefore, it is required to etch silicon without using a plasma in view of a low environmental load and a low cost.

As for a method for etching silicon without using a plasma, there is suggested a method using fluorine ($F_2$) gas and nitrogen monoxide (NO) gas or a method using nitrosyl fluoride (FNO) gas. Specifically, there is known a method for removing a silicon deposit by simultaneously supplying fluorine gas and nitrogen monoxide gas (see, e.g., Japanese Patent No. 4739709).

However, when fluorine gas, nitrogen monoxide gas and nitrosyl fluoride gas are simultaneously supplied, all the gases act as etching species and, thus, simultaneous etching by the respective etching species occurs. Accordingly, it is difficult to control an etching rate, a shape after etching, or the like. Recently, it has been confirmed that an etching shape is changed when a temperature of the wafer is changed in the case of simultaneously supplying fluorine gas, nitrogen monoxide gas and nitrosyl fluoride gas (see, e.g., Tajima Satoshi et al., "MEMS sacrificial layer Si etching without using a plasma", NanotechJapan Bulletin Vol. 7, No. 4, 2014, "Nanotechnology EXPRESS" the $26^{th}$ Special Issue, 1-5. Specifically, when the temperature of the wafer is 230° C. or above, the etching rate is increased but it is easy to control the shape after the etching due to surface orientation. When the temperature of the wafer is lower than 230° C. and higher than or equal to 60° C., the etching rate is decreased and the controllability of the shape after etching is improved. Therefore, in the case of supplying a plurality of gases acting as etching species, a desired etching shape can be obtained by controlling a temperature of the wafer.

However, when the temperature of the wafer is lower than 60° C. which is a practical temperature, an agglomerated layer of fluorine, nitrogen monoxide and nitrosyl fluoride is generated, and the respective etching species in the agglomerated layer react with silicon at different etching rates. Thus, the etching rate is considerably increased and the shape after etching becomes poor. In other words, in the case of simultaneously supplying a plurality of gases acting as etching species, it is difficult to appropriately control the etching rate or the shape after etching.

SUMMARY OF THE INVENTION

In view of the above, the disclosure provides a substrate processing method and a substrate processing apparatus which can appropriately control etching of a silicon-based film.

In accordance with a first aspect of the present disclosure, there is provided a substrate processing method including: a fluorine-based gas supply step of supplying a fluorine-based gas into a processing chamber where a substrate having a silicon-based film is accommodated; a purge gas supply step of supplying a purge gas for discharging the supplied fluorine-based gas into the processing chamber; and a nitrogen-based gas supply step of supplying a nitrogen-based gas into the processing chamber from which the fluorine-based gas has been discharged.

In accordance with a second aspect of the present disclosure, there is provided a substrate processing apparatus including: a processing chamber configured to accommodate a substrate having a silicon-based film, (a) a fluorine-based gas supply system configured to supply a fluorine-based gas into the processing chamber; (b) a purge gas supply system configured to supply a purge gas into the processing chamber; (c) a nitrogen-based gas supply system configured to supply a nitrogen-based gas into the processing chamber; (d) a temperature controller configured to control a temperature of the substrate; and a control unit configured to control operations of the (a) to (d), wherein the control unit supplies the fluorine-based gas into the processing chamber by using the fluorine-based gas supply system, supplies the purge gas into the processing chamber by using the purge gas supply system to discharge the supplied fluorine-based gas, and then supplies the nitrogen-based gas into the processing chamber, from which the fluorine-based gas has been discharged, by using the nitrogen-based gas supply system.

BRIEF DESCRIPTION OF THE DRAWINGS

The objects and features of the disclosure will become apparent from the following description of embodiments, given in conjunction with the accompanying drawings, in which:

FIG. 3 is a flowchart showing the etching process of FIGS. 2A to 2F.

DETAILED DESCRIPTION OF THE EMBODIMENTS

Hereinafter, embodiments will be described in detail with reference to the accompanying drawings.

Figure 1:
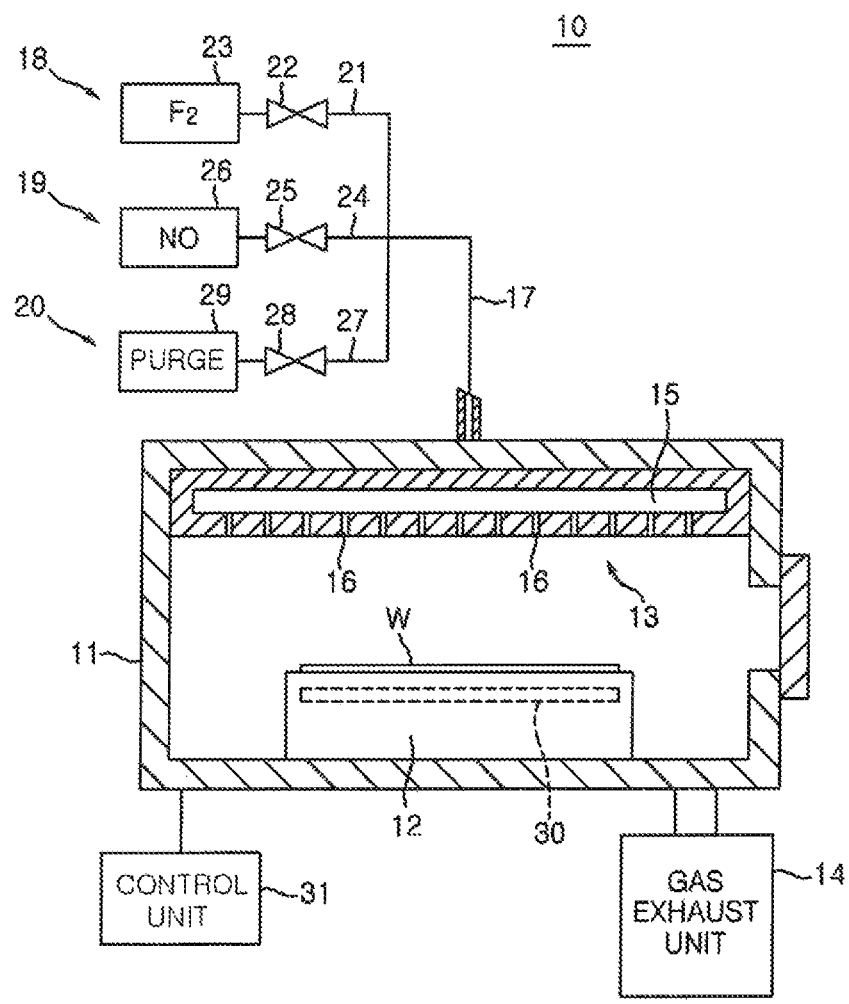
FIG. 1 is a cross sectional view schematically showing a configuration of an etching apparatus as a substrate processing apparatus according to an embodiment.

FIG. 1 is a cross sectional view schematically showing a configuration of an etching apparatus as a substrate processing apparatus according to an embodiment.

In FIG. 1, an etching apparatus 10 includes a chamber 11 as a processing space, a mounting table 12 provided in the chamber 11, a shower head 13 provided at an upper portion of the chamber 11 to face the mounting table 12, and a gas exhaust unit 14 for exhausting a gas in the chamber 11. The etching apparatus 10 performs an etching process on a wafer W made of silicon or having on a surface thereof a silicon-based film. The wafer W is mounted on the mounting table 12.

The shower head 13 is formed in a plate shape and has therein a buffer space 15. The buffer space 15 communicates with an inside of the chamber 11 through a plurality of gas injection holes 16. The shower head 13 is connected to a fluorine gas supply system 18 (fluorine-based gas supply system), a nitrogen monoxide gas supply system 19 (nitrogen-based gas supply system) and a purge gas supply system 20 (purge gas supply system) through a gas supply line 17. The fluorine gas supply system 18 includes a fluorine gas supply line 21 connected to the gas supply line 17, a fluorine gas valve 22 provided in the fluorine gas supply line 21, and a fluorine gas supply unit 23 connected to the fluorine gas supply line 21. The nitrogen monoxide gas supply system 19 includes a nitrogen monoxide gas supply line 24 connected to the gas supply line 17, a nitrogen monoxide gas valve 25 provided in the nitrogen monoxide gas supply line 24, and a nitrogen monoxide gas supply unit 26 connected to the nitrogen monoxide gas supply line 24. The purge gas supply system 20 includes a purge gas supply line 27 connected to the gas supply line 17, a purge gas valve 28 provided in the purge gas supply line 27, and a purge gas supply unit 29 connected to the purge gas supply line 27.

The fluorine gas supply system 18 supplies a fluorine gas into the buffer space 15 through the gas supply line 17 and controls a flow rate of the supplied fluorine gas. The fluorine gas valve 22 permits or limits communication of the fluorine gas supply line 21. The nitrogen monoxide gas supply system 19 supplies a nitrogen monoxide gas into the buffer space 15 through the gas supply line 17 and controls a flow rate of the supplied nitrogen monoxide gas. The nitrogen monoxide gas valve 25 permits or limits communication of the nitrogen monoxide gas supply line 24. The purge gas supply system 20 supplies a purge gas, e.g., argon (Ar) gas or nitrogen ($N_2$) gas, into the buffer space 15 through the gas supply line 17 and controls a flow rate of the supplied purge gas. The purge gas valve 28 permits or limits communication of the purge gas supply line 27.

The shower head 13 supplies the fluorine gas, the nitrogen monoxide gas and the purge gas supplied in the buffer space 15 into the chamber 11 through the gas injection holes 16. At this time, in the etching apparatus 10, types of gases to be supplied into the buffer space 15 and further into the chamber 11 can be selectively switched by switching opening/closing of the fluorine gas valve 22, the nitrogen monoxide gas valve 25 and the purge gas valve 28.

The mounting table 12 is provided at a bottom portion of the chamber 11. A temperature controller 30 is provided in the mounting table 12. The temperature controller 30 includes a conduit through which a temperature control medium, e.g., water or the like, circulates. A temperature of the mounting table 12 is controlled by heat exchange with the temperature control medium flowing in the conduit. Accordingly, a temperature of the wafer W mounted on the mounting table 12 is controlled.

The etching apparatus 10 further includes a control unit 31 (controller) for controlling the respective components of the etching apparatus 10. The control unit 31 includes a process controller having a microprocessor (computer) and a storage unit having a memory. The storage unit stores control programs for realizing desired processes performed in the etching apparatus 10, e.g., the supply of various gases, the exhaust of the chamber 11 and the like, under the control of the process controller, control recipes that are control programs for allowing the respective components of the etching apparatus 10 to perform desired processes based on processing conditions, various database and the like. The control unit 31 reads out the processing recipes or the like from the storage unit and executes the read-out processing recipes or the like in the process controller. Accordingly, a desired process, e.g., an etching process of a silicon-based film, is carried out.

FIGS. 2A to 2F are process diagrams showing a silicon-based film etching process as a substrate processing method according to an embodiment which is performed by the etching apparatus shown in FIG. 1. FIG. 3 is a flowchart showing the etching process.

First, a temperature of the wafer W mounted on the mounting table 12 is maintained at 60° C. or less by the temperature controller 30 (step S31). Then, a fluorine gas is supplied from the fluorine gas supply system 18 into the chamber 11 (step S32) (fluorine-based gas supply step).

Figure 2A:
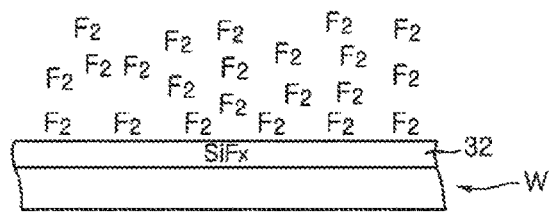
FIGS. 2A to 2F are process diagrams showing a silicon-based film etching process as a substrate processing method according to an embodiment which is performed by the etching apparatus shown in FIG. 1.
Figure 2B:
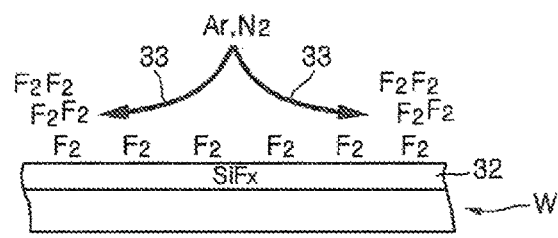
Figure 2C:
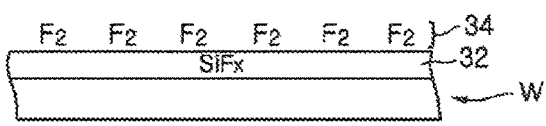

At this time, as shown in FIG. 2A, a part of the supplied fluorine gas chemically reacts with a silicon-based film on the surface of the wafer W. As a consequence, the top surface of the wafer W is modified and a silicon fluoride film 32 is formed. The silicon fluoride film 32 is in the form of $SiF_X$ (X being a natural number ranging from 1 to 3). It is known that the number of fluorine atoms in a silicon fluoride molecule mainly forming the silicon fluoride film 32 is decreased as the temperature of the wafer W is decreased. This is because the number of fluorine atoms in a silicon fluoride molecule depends on the temperature of the wafer W and high energy is required for bonding between a fluorine atom and a silicon atom. For example, it is known that when the temperature of the wafer W is −23° C. (250K) or less, the number of fluorine atoms is one; when the temperature of the wafer W is in a range from 27° C. (300K) to 177° C. (450K), the number of fluorine atoms is two; and when the temperature of the wafer W is 257° C. (530K) or above, the number of fluorine atoms is three (see, e.g., the article "V. S. Aliev et al., F Adsorption of molecular fluorine on the Si (100) surface: an ellipsometric study) Surface Science 347 (1996) 97-104".).

Another part of the supplied fluorine gas is physically adsorbed onto the surface of the wafer W, i.e., the surface of the silicon fluoride film 32 (see FIG. 2A). When the temperature of the wafer W is low, the fluorine gas is easily physically adsorbed onto the surface of the wafer W (see the above article). Especially, when the temperature of the wafer W is 60° C. or less, the fluorine gas is relatively firmly physically adsorbed onto the surface of the silicon fluoride film 32. The remaining (excessive) fluorine gas floats in the chamber 11 (see FIG. 2A).

Next, in a state where the temperature of the wafer W is maintained at 60° C. or less by the temperature controller 30, a purge gas, e.g., argon gas or nitrogen gas, is supplied from the purge gas supply system 20 into the chamber 11 (step S33) (purge gas supply step). At this time, the excessive fluorine gas floating in the chamber 11 is discharged to the outside of the chamber 11 through the gas exhaust unit 14 by a purge gas 33 supplied into the chamber 11. On the other hand, since the temperature of the wafer W is maintained at 60° C. or less, the fluorine gas existing on the surface of the silicon fluoride film 32 is relatively firmly physically adsorbed onto the surface. Therefore, the fluorine gas existing on the surface of the silicon fluoride film 32 remains on the corresponding surface without being discharged to the outside of the chamber 11 by the purge gas (see FIG. 2B). As a result, a fluorine gas molecular layer 34 is formed on the surface of the silicon fluoride film 32, the fluorine gas molecular layer 34 containing a plurality of fluorine gas molecules each of which is arranged in a single layer along the surface of the silicon fluoride film 32 (see FIG. 2C).

Figure 2D:
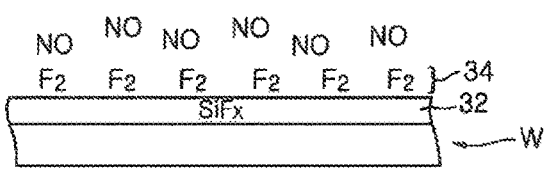
Figure 2E:
Figure 2F:
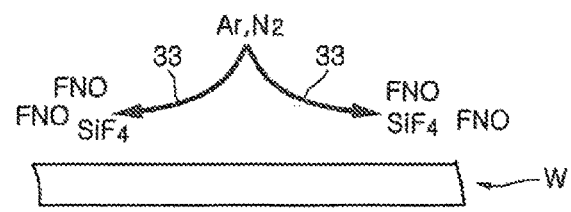

Next, as shown in FIG. 2D, after the excessive fluorine gas is discharged to the outside of the chamber 11, a nitrogen monoxide gas is supplied from the nitrogen monoxide gas supply system 19 into the chamber 11 (step S34) (nitrogen-based gas supply step). At this time, chemical (reduction) reaction between nitrogen monoxide molecules of the supplied nitrogen monoxide gas and the fluorine gas molecules of the fluorine gas molecular layer 34 which are physically adsorbed onto the surface of the silicon fluoride film 32 occurs, as will be shown in a following Eq. (1). Accordingly, nitrosyl fluoride and fluorine radicals are generated.

$$F_2 + NO \rightarrow FNO\uparrow + F^* \qquad \text{Eq. (1)}$$

Nitrosyl fluoride becomes a gas immediately at a room temperature and thus floats in the form of nitrosyl fluoride gas in the chamber 11. The number of fluorine atoms in each silicon fluoride molecule of the silicon fluoride film 32 is 3 or less and a dangling bond exists in a silicon atom. Therefore, fluorine radicals are bonded with a fluorine atom in each silicon fluoride molecule, as will be shown in a following Eq. (2).

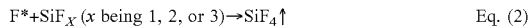
$$F^* + SiF_X \text{ (}x \text{ being 1, 2, or 3)} \rightarrow SiF_4\uparrow \qquad \text{Eq. (2)}$$

As a result, silicon tetrafluoride ($SiF_4$) is generated from the silicon fluoride film 32. Silicon tetrafluoride ($SiF_4$) sublimates immediately and floats in the form of a silicon tetrafluoride gas in the chamber 11 (see FIG. 2E).

Next, a purge gas is supplied from the purge gas supply system 20 into the chamber 11 (step S35) (another purge gas supply step). At this time, the nitrosyl fluoride gas and the silicon tetrafluoride gas floating in the chamber 11 are discharged to the outside of the chamber 11 by a purge gas 33 supplied into the chamber 11 (see FIG. 2F).

By removing the silicon fluoride film 32 through the steps S31 to S35, the silicon-based film of the wafer W is etched. Then, it is determined whether or not the etching amount of the silicon-based film has reached a predetermined amount (step S36). When the etching amount has not reached the predetermined amount, the process returns to the step S32. When the etching amount has reached the predetermined amount, the process is completed.

In the above-described etching process, first, the fluorine gas is supplied into the chamber 11 where the wafer W is accommodated. Then, the purge gas for purging the supplied fluorine gas is supplied into the chamber 11. Next, a nitrogen monoxide gas is supplied into the chamber 11 from which the fluorine gas has been exhausted. Therefore, a plurality of etching species such as the fluorine gas, the nitrogen monoxide gas and the like does not exist at the same time in the chamber 11, and simultaneous etching by the plurality of etching species (e.g., the fluorine gas, the nitrogen monoxide gas and the nitrosyl fluoride gas) can be avoided. As a result, it is possible to prevent the surface of the substrate from becoming rough due to disordered etching.

In the above-described etching process, when the fluorine gas and the purge gas are supplied into the chamber 11, the temperature of the wafer W is maintained at 60° C. or less. Therefore, the fluorine gas is relatively firmly physically adsorbed onto the surface of the wafer W and, at the same time, the top surface of the wafer W is modified to the silicon fluoride film 32. The fluorine gas that is not physically adsorbed thereonto is discharged to the outside of the chamber 11 by the purge gas. Then, when the nitrogen monoxide gas is supplied, fluorine radicals that are generated from the fluorine gas by reduction of the nitrogen monoxide gas react with silicon fluoride molecules of the silicon fluoride film 32 and sublimate. At this time, the fluorine gas from which the fluorine radicals are generated is limited to a fluorine gas that is physically adsorbed onto the surface of the wafer W. Therefore, the amount of supplied fluorine radicals is limited and, also, the amount of the silicon fluoride film 32 that reacts with the fluorine radicals and sublimates is limited. Specifically, the thickness of the fluorine gas molecular layer 34 formed on the surface of the silicon fluoride film 32 corresponds to a size of a single fluorine gas molecule. Further, a single fluorine gas molecule is required for sublimation of a single silicon fluoride molecule, as can be seen from the above Eqs. (1) and (2). Thus, the thickness of the silicon fluoride film 32 removed by single etching (removal of the silicon fluoride film 32) corresponds to a size of a single silicon fluoride molecule. In other words, the single etching corresponds to ALE (Atomic layer Etching). As a result, the amount of the silicon-based film on the surface of the wafer W which is removed by the above-described etching process is limited. In other words, the removal amount of the silicon-based film can be limited in a state where the temperature of the wafer W is maintained at 60° C. or less, so that the etching of the silicon-based film can be appropriately controlled at the practical temperature of the wafer W.

In the above-described etching process, the supply of the fluorine gas into the chamber 11, the discharge of the supplied fluorine gas, the supply of the nitrogen monoxide gas into the chamber 11, and the discharge of the nitrosyl fluoride gas and the silicon tetrafluoride gas are repeated in that order. Therefore, the etching amount of the silicon-based film can be easily controlled by controlling the number of repetition.

However, when the generated silicon fluoride film 32 mainly contains silicon trifluoride ($SiF_3$), silicon tetrafluoride is immediately generated by supplying a single fluorine radical to each silicon fluoride molecule. Therefore, in view of facilitated removal of the silicon fluoride film 32, it is preferable that the silicon fluoride film 32 mainly contains $SiF_3$. However, as described above, the temperature of the wafer W needs to be maintained at 257° C. or above in order to obtain the silicon fluoride film 32 mainly containing $SiF_3$. At this time, it is difficult for the fluorine gas to remain on the surface of the silicon fluoride film 32 because its kinetic energy is increased by heat. Therefore, the fluorine gas molecular layer 34 exists on a part of the surface of the silicon fluoride film 32. Accordingly, the sublimation of silicon tetrafluoride which is caused by the supply of the nitrogen monoxide gas occurs on a part of the surface of the silicon fluoride film 32. As a result, the silicon fluoride film 32 is partially removed and a smooth surface cannot be obtained after the etching. In the above-described etching process, the temperature of the wafer W is maintained at 60° C. or less and, thus, the fluorine gas is relatively firmly physically adsorbed onto the surface of the wafer W and the fluorine gas molecular layer 34 covers the entire surface of the silicon fluoride film 32. Accordingly, the sublimation of silicon tetrafluoride which is caused by the supply of the nitrogen monoxide gas can occur on the entire surface of the silicon fluoride film 32 and the silicon fluoride film 32 can be entirely removed. As a result, a smooth surface can be obtained after the etching.

The chemical reaction of the silicon-based film in the above-described etching process is expressed by following Eqs. (3) to (6).

$$Si + 2F_2 \rightarrow SiF_2\text{---}F_2 \text{ (adsorption)} \qquad \text{Eq. (3)}$$

$$SiF_2\text{---}F_2 + NO \rightarrow SiF_3 + FNO\uparrow \qquad \text{Eq. (4)}$$

$$SiF_3 + F_2 \rightarrow SiF_3\text{---}F_2 \text{ (adsorption)} \qquad \text{Eq. (5)}$$

$$SiF_3\text{---}F_2 + NO \rightarrow SiF_4\uparrow + FNO\uparrow \qquad \text{Eq. (6)}$$

Further, in the above-described etching process, the generation and the removal of the silicon fluoride film 32 are performed by switching types of gases to be supplied into the chamber 11. In other words, since the generation and the removal of the silicon fluoride film 32 are performed in the same chamber 11, it is not necessary to provide two chambers for the generation of the silicon fluoride film 32 and the removal of the silicon fluoride film 32. As a consequence, the configuration of the etching apparatus 10 can be simplified.

While the embodiments have been described, the present disclosure is not limited to the above-described embodiments.

For example, in the above-described etching process, the temperature of the wafer W is maintained at 60° C. or less. However, if a somewhat rough surface after etching is allowable, it is not necessary that the fluorine gas is relatively firmly physically adsorbed onto the surface of the wafer W and the fluorine gas molecular layer 34 covers the entire surface of the silicon fluoride film 32. Therefore, the temperature of the wafer W can be set to a level higher than 60° C. at the time of supplying a fluorine gas into the chamber 11 (step S32) or at the time of supplying a purge gas (step S33).

In the above-described etching process, the fluorine gas is supplied into the chamber 11 and physically adsorbed onto the surface of the wafer W (silicon fluoride film 32). However, it is also possible to supply a fluoride-based gas, e.g., hydrogen fluoride (HF) gas, which can be physically adsorbed onto the surface of the wafer W, instead of the fluorine gas. Further, in the above-described etching process, fluorine radicals are generated by supplying the nitrogen monoxide gas into the chamber 11 and reducing fluorine gas molecules. However, it is also possible to supply a nitrogen-based gas that can reduce fluorine gas molecules, instead of the nitrogen monoxide gas.

The object of the present disclosure can also be realized by supplying a storage unit in which a program code of software that realizes the functions of the above-described embodiments is stored to the process controller of the control unit 31, and causing a CPU of the process controller to read out and execute the program code stored in the storage unit.

In this case, the program code itself read out from the storage unit realizes the functions of the above-described embodiments and, thus, the program code and the storage unit in which the program code is stored constitute the present disclosure.

The storage unit may be, e.g., a RAM, a NV-RAM, a floppy (registered trademark) disk, a hard disk, a magneto-optical disk, an optical disk such as CD-ROM, CD-R, CD-RW, DVD (DVD-ROM, DVD-RAM, DVD-RW, DVD+RW), a magnetic tape, a non-volatile memory card, another ROM or the like which may store the program code. Alternatively, the program code may be downloaded from another computer (not shown), database or the like connected to the Internet, a commercial network or a local area network and then supplied to the process controller.

The functions of the above-described embodiments may be realized not only by executing the program code read out by the process controller but also by causing an OS (operating system) or the like which operates in the CPU to perform a part or all of actual operations based on instructions of the program code.

The functions of the above-described embodiments may also be realized by storing the program code read out from the storage unit in a memory provided for a functional extension board inserted into the process controller or a function extension unit connected to the process controller and then causing the CPU provided for the functional extension board or the function extension unit to perform a part or all of the actual operations based on the instructions of the program code.

The program code may be an object code, a program code executed by an interpreter, script data supplied to the OS, or the like.

While the disclosure has been shown and described with respect to the embodiments, it will be understood by those skilled in the art that various changes and modifications may be made without departing from the scope of the disclosure as defined in the following claims.

What is claimed is:

1. A substrate processing method for etching a silicon-based film of a substrate without using a plasma, the method comprising:
    a step of supplying a fluorine-based gas into a processing chamber where the substrate having the silicon-based film is accommodated;
    a step of supplying a first purge gas for discharging the supplied fluorine-based gas into the processing chamber; and
    a step of supplying a nitrogen-based gas into the processing chamber from which the fluorine-based gas has been discharged,
    wherein at least in the step of supplying the fluorine-based gas and the step of supplying the first purge gas, a temperature of the substrate is maintained at 60° C. or less.

2. The substrate processing method of claim 1, further comprising a step of supplying a second purge gas for discharging the supplied nitrogen-based gas into the processing chamber,
    wherein the step of supplying the fluoride-based gas, the step of supplying the first purge gas, the step of supplying the nitrogen-based gas and the step of supplying the second purge gas are repeated in that order.

3. The substrate processing method of claim 1, further comprising a step of supplying a second purge gas for discharging the supplied nitrogen-based gas into the processing chamber and a step of determining whether or not an etching amount of the silicon-based film has reached a predetermined amount,
    wherein the step of supplying the fluoride-based gas, the step of supplying the first purge gas, the step of supplying the nitrogen-based gas and the step of supplying the second purge gas are repeated in that order until the etching amount of the silicon-based film has reached the predetermined amount.

4. The substrate processing method of claim 1, wherein the fluorine-based gas is fluorine (F2) gas.

5. The substrate processing method of claim 1, wherein the nitrogen-based gas is nitrogen monoxide (NO) gas.

* * * * *